United States Patent
Chua et al.

(10) Patent No.: US 7,638,793 B2
(45) Date of Patent: *Dec. 29, 2009

(54) N-CHANNEL TRANSISTOR

(75) Inventors: Lay-Lay Chua, Singapore (SG); Peter Kian-Hoon Ho, Singapore (SG); Richard Henry Friend, Cambridge (GB)

(73) Assignee: Cambridge Enterprise Ltd, Cambridge (GB)

( * ) Notice: Subject to any disclaimer, the term of this patent is extended or adjusted under 35 U.S.C. 154(b) by 78 days.

This patent is subject to a terminal disclaimer.

(21) Appl. No.: 10/586,149

(22) PCT Filed: Jan. 17, 2005

(86) PCT No.: PCT/GB2005/000132

§ 371 (c)(1),
(2), (4) Date: Oct. 31, 2006

(87) PCT Pub. No.: WO2005/069401

PCT Pub. Date: Jul. 28, 2005

(65) Prior Publication Data

US 2007/0295955 A1    Dec. 27, 2007

(30) Foreign Application Priority Data

Jan. 16, 2004 (GB) ................... 0400997.3

(51) Int. Cl.
*H01L 29/08* (2006.01)
(52) U.S. Cl. .......................... 257/40; 438/99
(58) Field of Classification Search ............ 257/40; 438/99
See application file for complete search history.

(56) References Cited

U.S. PATENT DOCUMENTS

| 6,905,906 B2* | 6/2005 | Sirringhaus et al. ........... 438/99 |
| 2005/0134318 A1* | 6/2005 | Baude et al. ................ 326/104 |
| 2007/0278478 A1* | 12/2007 | Zaumseil et al. .............. 257/40 |

FOREIGN PATENT DOCUMENTS

| EP | 1 102 335 A2 | 5/2001 |
| EP | 1 306 909 A1 | 5/2003 |
| EP | 1 306 910 A1 | 5/2003 |
| JP | 10209459 A | 8/1998 |

(Continued)

OTHER PUBLICATIONS

E.J. Meijer et al., << Solution-processed ambipolary organic field-effect transistors and inverters >>, Nature Materials, vol. 2, 21, pp. 678-682 (Sep. 21, 2003).

(Continued)

*Primary Examiner*—Wai-Sing Louie
*Assistant Examiner*—Bilkis Jahan
(74) *Attorney, Agent, or Firm*—Sughrue Mion, PLLC

(57) ABSTRACT

An n-channel or ambipolar field-effect transistor including an organic semiconductive layer having an electron affinity $EA_{semicond}$; and an organic gate dielectric layer forming an interface with the semiconductive layer; characterized in that the bulk concentration of trapping groups in the gate dielectric layer is less than $10^{18}$ cm$^{-3}$, where a trapping group is a group having (i) an electron affinity $EA_X$ greater than or equal to $EA_{semicond}$ and/or (ii) a reactive electron affinity $EA_{rxn}$ greater than or equal to $(EA_{semicond}.-2\ eV)$.

21 Claims, 5 Drawing Sheets

FOREIGN PATENT DOCUMENTS

WO 2004006353 A2 1/2004

OTHER PUBLICATIONS

Lay-Lay Chua et al., "General observation of n-type field-effect behavior in organic semiconductors", Nature, ISSN: 0028-0836, vol. 434, No. 7030, pp. 194-199 (Mar. 10, 2005).

European Search Report dated Oct. 8, 2008.

Aline Hepp, et al., Light—Emitting Field Effect Transistor Based on a Tetracene Thin Film, vol. 91, No. 15, Oct. 10, 2003, pp. 157406-1 thru 157406-4, XP00232890.

J. H. Schon, et al., A Light Emitting Field—Effect Transistor, vol. 290, Nov. 3, 2000, pp. 963-965, XP002327889.

\* cited by examiner

N-CHANNEL TRANSISTOR

The present invention concerns a new transistor capable of n-channel field effect conduction and a method for making the same.

Field-effect transistors (FETs), are three-terminal devices that comprise a source contact, a drain contact, and a gate contact. A semiconductive layer (the "channel") bridges the source and drain contacts, and is itself spaced from the gate contact by an insulating layer called the gate dielectric. In organic transistors, the semiconductive layer is fabricated from a semiconductive organic material. In particular, in polymer transistors, the semiconductive organic layer is fabricated from a semiconductive polymer, typically a n-conjugated organic polymer. This layer may be deposited in the device by a precursor route or directly by solution processing.

A voltage is applied across the source contact and the drain contact. Further, in a field effect transistor, a voltage is applied to the gate contact. This voltage creates a field that alters the current-voltage characteristics of the semiconductive layer lying directly next to the gate dielectric by causing accumulation or depletion of charge carriers there. This in turn modulates the channel resistance and the rate at which charges pass from the source to the drain contact (that is, the source-drain current) for a given source-drain voltage.

In principle, organic field effect transistors (FETs) can operate in two modes; either as an n-channel device (where the charges accumulated in the channel are electrons) or a p-channel device (where the charges accumulated in the channel are holes).

Advanced Functional Materials 13 (2003) pg 199-204 presents a new effect influencing the operation of p-channel organic field-effect transistors resulting from the choice of the gate insulator material. This document is not concerned with n-channel conduction. This document investigates a number of gate insulators with varying dielectric constant and polarity. It is reported that p-channel device performance improved with low-k insulators.

Specifically, it is stated that a consistent trend emerged of improved hole mobility when low-k insulators were used. An FET hole mobility of $6 \times 10^{-3}$ $cm^2V^{-1}s^{-1}$ is said to be possible in the PTAA derivatives tested. It is hypothesised that the observed effect was due to the change in energetic disorder at the semiconductor/gate dielectric interface. In this regard it is said that low polarity interfaces are shown to be beneficial. It is further said that this leads to trap filling at lower gate potential and that reduced threshold voltages therefore can be attained.

The insulator materials investigated range from silicon dioxide, poly(vinyl phenol) (PVP), poly(methyl methacrylate) (PMMA), poly(vinyl alcohol) (PVA), poly(perfluoroethylene-co-butenyl vinyl ether), cyanopullulane, polyisobutylene, poly(4-methyl-1-pentene), and a copolymer of polypropylene: poly[propylene-co-(1-butene)].

It is particularly advantageous to be able to realise both n- and p-channel organic FETs. This opens up the possibility of fabricating complementary circuits with extremely low standby power consumption, as is known in the field of inorganic Si FETs (P. Horowitz and W. Hill, The Art of Electronics, Cambridge University Press, 1989). One particularly simple way to generate a complementary circuit is to realise both n- and p-channel conduction in the same device (simply by selecting an appropriate gate-voltage polarity). Such a device is said to be ambipolar, and has been demonstrated with inorganic amorphous Si (H. Pfleiderer, W. Kusian and B. Bullemer, Siemens Forschungs—Und Entwicklungsberichte—Siemens Research and Development Reports 14 (1985) pp. 114).

However, to date, it has been generally accepted that n-channel organic FETs are limited to special classes of very-high electron-affinity (EA) semiconductors, such as those containing perylenetetracarboxylate diimide/dianhydride, naphthalenetetracarboxylate diimide/dianhydride or phthalocyanine units; or those with very small bandgaps (less than or equal to 1.6 eV), which by virtue of their small bandgaps do have very high electron-affinity.

Some specific examples of small molecule n-channel semiconductive materials that have been used are:

Bis(phthalocyanines) (G. Guillaud, M. A. Sadound and M. Maitrot, Chemical Physics Letters 167 (1990) pg. 503)

Tetracyanoquinodimethane (A. R. Brown, D. M. de Leeuw, E. J. Lous and E. E. Havinga, Synthetic Metals 66 (1994) pg. 257).

Dianhydrides and diimides of napthalenetetracarboxylic acids (J. G. Laquindanum, H. E. Katz, A. Dodabalapur and A. J. Lovinger, Journal of the American Chemical Society 118 (1996) pg. 11331; H. E. Katz, A. J. Lovinger, J. Johnson, C. Kloc, T. Siegrist, W. Li, Y-Y. Lin and A. Dodabalapur, Nature 404 (2000) pg. 478.

Diimides of perylenetetracarboxlic acids (C. D. Dimitrakopoulos and P. R. L. Malenfant, Advanced Materials 14 (2002) pg. 99).

Examples of small molecule n-channel semiconductive materials are also known from Katz et al, Nature 404 (2000) pg. 478-481. This document in fact mentions the possibility of an organic polyimide dielectric. However, no example of a suitable polyimide is given and no information is provided regarding how a suitable polyimide may be selected. Further, typically polyimides contain 1-5% residual —COOH groups.

Some examples of high electron-affinity oligomer n-channel semiconductive materials that have been used with an inorganic dielectric are:

α,ω-diperfluorohexylsexithiophene (A. Facchetti, Y. Deng, A. Wang, Y. Koide, H. Sirringhaus, T. Marks and R. H. Friend, Angewangte Chemie International Edition 39 (2000) pg. 4545).

Quinodal terthiophene (R. J. Chesterfield, C. R. Newman, T. M. Pappenfus, P. C. Ewbank, M. H. Haukaas, K. R. Mann, L. L. Miller and C. D. Frisbie, Advanced Materials 15 (2003) pg. 1278.

An example of a high electron-affinity polymer n-channel semiconductive material that has been used with an inorganic dielectric is:

Poly(benzobisimidazobenzophenanthroline) (A. Babel and S. A. Jenekhe, Journal of the American Chemical Society 125 (2003) pg. 13656. This is a very high EA polymer with electron-withdrawing imine nitrogens in the stiff polymer backbone.

To date, it also has been generally accepted that materials that do not fall within the above "special classes" do not show and are not expected to show n-channel semiconductor behaviour. As a result, the choice of semiconductor materials for n-channel organic FETs has been severely limited.

Very high-electron affinity materials (and low-bandgap materials) can have their own limitations. For example, they may be unintentionally doped by adventitious impurities, for example, $H^+$, ammonium and metal ions, especially under bias to a permanently conducting state. Therefore it would be advantageous to be able to develop n-channel and ambipolar transistors from a general class of materials with more moderate bandgaps and electron-affinities.

As described in Nature Materials 2 (2003) pg. 678, one of the main difficulties in achieving ambipolar transistor operation is the injection of holes and electrons into a single semiconductor from the same electrode. This electrode needs to have a workfunction that allows injection of holes in the highest occupied molecular orbital (HOMO) of the semiconductor, and the injection of electrons in the lowest unoccupied molecular orbital (LUMO). Consequently, this will result in an injection barrier of at least half of the bandgap energy for one of the carriers.

The above difficulty in achieving the injection of holes and electrons into a single semiconductor from the same electrode, of course, is greatly compounded by the fact that n-channel activity in organic FETs in any case has been difficult to achieve even with the appropriate electron injection. This has led to a general (erroneous) view that electrons are somehow trapped (and thus rendered immobile) in most organic materials, and therefore (again erroneously) no useful n-channel FETs could be made from the vast majority of these materials.

Never the less, this Nature Materials 2 document demonstrates ambipolar transistors using a thermally grown inorganic $SiO_2$ layer as the gate dielectric and heterogeneous blends, consisting of interpenetrating networks of p-type and n-type semiconductors, as the semiconductive layer. A blend of a derivatised C60 (PCBM) which has a very high electron-affinity as the semiconductive electron transporter and OC1C10-PPV polymer as the semiconductive hole transporter is exemplified. The HOMO level of the OC1C10 polymer is aligned with the work function of the gold electrode. A 1.4 eV mismatch is reported between the LUMO level of the PCBM and the work function of the gold electrode.

This document also suggests that the lack of ambipolar transistor action in wide bandgap semiconductors is due to the presence of large injection barriers. The reduction of the barrier is suggested by using small bandgap semiconductors. Poly(indenofluorene) is exemplified, which has a bandgap of 1.55 eV.

However, the electron field effect mobilities that have been realized in this document are still unacceptably low in the $10^{-5}$ cm$^2$/Vs domain. (PIF, electron mobility, $5 \times 10^{-5}$ cm$^2$/Vs vs hole mobility, $4 \times 10^{-5}$ cm$^2$/Vs; and for $C_{60}$—OC1C10-PPV, electron mobility, $3 \times 10^{-5}$ cm$^2$/Vs vs hole mobility, $7 \times 10^{-4}$ cm$^2$/Vs).

Clearly, the range of ambipolar transistors that may be made according to this teaching is restricted. Further, small bandgap semiconductors with n-n* gap <1.6 eV tend to be relatively less stable since they are vulnerable to unintentional doping, and facile photochemical reactions. On the other hand, electron-conducting blends with $C_{60}$ networks are not only unstable, due to facile chemical reactions of the $C_{60}$ anions and rapid oxygen trapping but suffer also from general instability of the percolation paths due to the recrystallisation of the small molecule electron-acceptor and transporter.

Prior to the above-described Nature Materials 2 document, Science 269 (1995) pg 1560 describes the use of an inorganic gate dielectric and a bilayer of a hole-conductor and electron-conductor to achieve ambipolar transistor behaviour. The electron conductor is $C_{60}$, with electron mobility measured in the range of $10^{-3}$ cm$^2$/Vs. This electron conductor suffers from the same problems as discussed above in relation to the Nature Materials 2 document.

It will be appreciated from the above that the main thrust of the effort to achieve n-channel FETs and ambipolar transistors has focused on the semiconductive layer, particularly the material used for the semiconductive layer and the organization, morphology and spatial ordering of the semiconductive material. Typically, semiconductive materials have been tested against an inorganic $SiO_2$ interface. It will be appreciated that this interface is invariably partially hydrated. Further, it will be appreciated that there exists a need for further improvement of n-channel conduction in n-channel organic FETs and ambipolar organic FETs since, currently, a very limited range of organic materials are useable in such devices.

The present invention aims to at least partially address this need and to provide in a first aspect a new n-channel transistor.

Further in a second aspect the present invention aims to provide a method for making a new transistor according to the first aspect of the present invention.

Still further in a third aspect the present invention aims to provide the use of a new transistor according to the first aspect of the present invention for n-channel conduction.

Thus, in a first aspect of the present invention there is provided an n-channel or ambipolar field-effect transistor including an organic semiconductive layer having an electron affinity $EA_{semicond}$; and an organic gate dielectric layer forming an interface with the semiconductive layer; characterised in that the bulk concentration of trapping groups in the gate dielectric layer is less than $10^{18}$ cm$^{-3}$, where a trapping group is a group having (i) an electron affinity $EA_x$ greater than or equal to $EA_{semicond}$ and/or (ii) a reactive electron affinity $EA_{rxn}$ greater than or equal to ($EA_{semicond}$−2).

For the purposes of the present invention, $EA_x$ and $EA_{rxn}$ are determined as described herein.

In a second aspect of the present invention there is provided a method for making a transistor as defined in the first aspect of the present invention.

In a third aspect of the present invention there is provided the use of a transistor as defined in the first aspect of the present invention for n-channel conduction.

In a fourth aspect of the present invention there is provided the use of an organic insulating material that does not contain any chemical groups having (i) $EA_x$ greater than or equal to 3 eV and/or (ii) $EA_{rxn}$ greater than or equal to 0.5 eV. According to the fourth aspect, preferably the organic insulating material does not contain any chemical groups having $EA_x$ greater than or equal to 2 eV. Also preferably, the organic insulating material does not contain any chemical groups having $EA_{rxn}$ greater than or equal to 0 eV. Most preferably, the organic insulating material does not contain any chemical groups having $EA_x$ greater than or equal to 1 eV. Also most preferably, the organic insulating material does not contain any chemical groups having $EA_{rxn}$ greater than or equal to −1 eV.

In a fifth aspect of the present invention there is provided a device or a part thereof including a transistor according to the first aspect of the present invention. In particular there is provided a circuit, complementary circuit or a logic circuit including a transistor according to the first aspect of the present invention.

In a sixth aspect of the present invention there is provided a method for making a device or a part thereof as defined in the fifth aspect of the present invention.

Almost all of the published work on n-channel transistors to date has focused on the preparation of organic semiconductors where n-channel conduction can be observed against a (hydrated) $SiO_2$ interface. Without wishing to be bound by theory, the present invention provides a new general design strategy to obtain n-channel conduction (and also ambipolar field-effect conduction) for a far wider range of organic semiconductors than is currently thought possible.

The present inventors have identified that n-channel field-effect conduction can be stably supported at a dielectric/semiconductor interface only if the dielectric does not present too high a concentration of chemical moieties that can trap the negative charge-carriers induced in the semiconductor channel by the field effect. Although the dielectric interface is the more important of the two, the dielectric bulk preferably also should be considered, since bulk trap states can still be populated albeit very slowly. The induced charge carriers travel along the interface and therefore are most severely affected by the traps they encounter at the interface. In contrast, the charge carriers must tunnel into the bulk to be trapped there. Nevertheless, the bulk trap states are capable of retaining charge for a long time, which is detrimental to transistor behavior.

The present inventors have discovered that by appropriate choice of the organic gate insulating material, it is indeed possible to obtain n-channel FETs from a much broader range of organic semiconductors than has been known hitherto. As such, the present invention provides for the first time the opportunity for n-channel conduction using an organic semiconductor and an organic dielectric. A broad range of poly(p-phenylenevinylene) and poly(fluorene) derivatives and copolymers have been tested successfully by the present inventors. The key is that the organic gate dielectric layer must not contain trapping groups (that lie in energy near to or below the electron-transport level of the organic semiconductor) above a critical concentration. As a result of this invention, the scope for obtaining n-channel organic FETs and ambipolar organic FETs is considerably expanded. It is no longer limited to the organic semiconductor being a very-high electron-affinity semiconductor.

The present inventors now have identified that the reason why n-channel FETs have been so elusive to date is that the gate dielectrics that have been tested to date (most notably, silicon oxide, poly(methyl methacrylate), poly(vinyl phenol) and poly(imide)) do not satisfy the specifications of the present invention.

According to the present invention one can distinguish between two kinds of trapping groups: reactive traps and non-reactive traps.

Reactive traps are those that undergo a subsequent chemical reaction so that the electron becomes trapped in a new (and deep) state that cannot ordinarily re-emit the electron. Hence, the trapping is not reversible. Particularly ubiquitous examples of reactive traps are those with active (acidic) hydrogens, such as —COOH, and —CR$_2$OH that can irreversibly trap electrons to expel hydrogen.

Non-reactive traps are those that can re-emit the trapped electrons. Reactive traps consume the induced carriers leading to static charging of the dielectric interface and gigantic shifts in threshold voltages, while non-reactive traps lead to loss of charge-carrier mobility. Both of these are detrimental to transistor devices. It is to be noted that the distinction between the two kinds of traps is not always clear-cut, since non-reactive traps in the presence of some impurities (such as H$_2$O) can turn into reactive traps.

The person skilled in the art is credited with knowing if a particular chemical group is capable of acting as a reactive trap, a non-reactive trap, or both, based on common knowledge of electrochemistry The present invention requires the total concentration of both reactive traps and non-reactive traps to be below a critical concentration. It will be appreciated that, according to the present invention, whether or not a group is a trapping group must be determined by reference to the EA$_{semicond.}$ of the organic semiconductive material which forms the semiconductive layer. Knowing the semiconductive material and thus EA$_{semicond.}$, a person skilled in the art will be able to use the analysis and the definitions for EA$_x$ and EA$_{rxn}$ given below, to order all chemical groups present in an organic gate dielectric layer under consideration into two series with respect firstly to EA$_x$ (i.e. according to their non-reactive trapping properties) and secondly to EA$_{rxn}$ (i.e. according to their reactive trapping properties). In the manner described, a person skilled in the art then can use the electron affinity of the semiconductor (EA$_{semicond}$) to provide the cut-off values to identify which groups are not trapping groups and so may be permitted to exist in the gate dielectric layer, and which other groups are trapping groups and so may not be present above the critical concentration in the gate dielectric layer.

Since the induced charge-carrier concentration typically is of the order of $10^{12}$-$10^{13}$ cm$^{-2}$ under normal FET operation, and the traps are filled first before FET conduction can occur, the critical concentration of reactive and non-reactive traps at the semiconductor/gate dielectric interface (C$_{interf}$) needs to be less than $10^{12}$ cm$^{-2}$, preferably less than $10^{11}$ cm$^{-2}$ and more preferably less than $10^{10}$ cm$^{-2}$.

The bulk concentration (c$_{bulk}$) corresponding to an interface concentration of $10^{12}$ cm$^{-2}$ is $10^{18}$ cm$^{-3}$ according to the equation $C_{interf} = (C_{bulk})^{2/3}$. Thus, in accordance with the present invention, the bulk concentration of trapping groups in the dielectric layer must be less than $10^{18}$ cm$^{-3}$. Taking into account interface segregation, the bulk concentration preferably is at least 1-2 orders of magnitude lower. A preferred bulk concentration therefore is below $10^{17}$ cm$^{-3}$.

One can measure the bulk concentration (c$_{bulk}$) of a trapping group of interest in the gate dielectric layer by a number of methods, including by FTIR. Several examples of suitable methods that can be used to measure the bulk concentration (c$_{bulk}$) are given below. These examples take OH groups as the trapping group of interest.

Method (A): Form a film of the test dielectric to a thickness of 50-100 microns on an IR-transparent substrate such as single-side-polished intrinsic Si wafer by drop-casting or blade coating. Measure the IR spectrum in an FTIR instrument. Collect sufficient scans for noise fluctuations to be less than $10^{-4}$ absorbance units. Look up the absorption band positions of the group in standard tables. For OH, this is at ca. 3300 cm$^{-1}$ and also ca. 900 cm$^{-1}$. Quantify the band absorption intensities at these wavenumbers. Convert to an effective concentration using literature values for the band absorptivity or calibration values from measuring the absorption spectra of a film of known thickness and with known concentrations of the OH group.

Method (B): Tag the group under test with a suitable fluorine or silicon label using standard gas-chromatography derivatisation methods, for example, by reacting the OH in the gate dielectric material with the appropriate fluoro anhydride. Purify. Make a film about 0.1-1 micron thick on an intrinsic silicon wafer. Carry out a secondary ion mass spectrometry measurement to measure the concentration of the labelled groups in the film after suitable calibration.

Method (C): Tag the group under test with a suitable fluorescent label using standard biochemical fluorescent probe labelling methods. Purify. Measure fluorescence activity to obtain concentration after suitable calibration.

Electron affinity (EA) is the energy released when the material accepts electrons from vacuum. Electron affinity is not directly related to the polarity of a material nor is there any correlation between electron affinity and dielectric constant.

According to the present invention, EA$_{semicond.}$ can be determined from cyclic voltammetry experiments for the organic semiconductor or from its measured ionization energy. The ionization energy (IE) of the organic semiconductor can be determined from standard ultraviolet photoemission experiments, as the onset of the valence band feature in the ultraviolet photoemission spectra. Less preferably, this quantity may also be estimated from standard cyclic voltammetry, as the midpoint potential ($E_o'$) of the coupled oxidation and reduction peaks or the onset oxidation potential ($E_{onset}$), in the oxidation scan. This potential is converted to the vacuum energy scale using a standard energy shift: IE=$E_o'$ (vs NHE)+4.8 eV or $E_{onset}$ (vs NHE)+4.8 eV.

The electron affinity (EA) is calculated from the ionization energy according to the following equation:

$$EA=IE-\Delta E-BE$$

The bandgap ($\Delta E$) is measured using optical absorption for example. The exciton binding energy (BE) is widely held to be 0.4 eV for a number of conjugated polymers.

Alternatively, the EA of the organic semiconductor can be measured in a more direct way by inverse photoemission, or by standard cyclic voltammetry as the midpoint potential ($E_o'$) of the coupled reduction and oxidation peaks or the onset reduction potential ($E_{onset}$), in a reduction scan. This potential is converted to the vacuum energy scale using a standard energy shift: IE=$E_o'$ (vs NHE)+4.8 eV or $E_{onset}$ (vs NHE)+4.8 eV.

For dielectric materials, because of their non-conducting, EA values are far more difficult to measure directly. However EA is a relatively local property of the chemical groups or moieties present in organic materials. In contrast, this is not the case for inorganic materials. Therefore, for the purposes of the present invention, whether an organic gate dielectric layer is compatible with the n-channel activity of a particular semiconductor is determined in part by comparing the individual EA's of the constituent moieties of the dielectric ($EA_x$ and $EA_{rxn}$) against $EA_{semicond}$. Because gas-phase EAs of a wide range of groups are available in the literature, this provides a useful a priori means to determine the $EA_x$ of a wide range of chemical groups present in candidate dielectrics for screening purposes.

The usual hydrocarbon backbone structural components present in organic dielectrics (such as the aliphatic chains and phenyl/phenylene units in polyalkylenes, polystyrenes etc) are not pi-extended and their solid state EAs are often <0 eV. This is far less than the electron affinity of a typical semiconductive material ($EA_{semicond}$), which is typically 2-3 eV (for example for polyfluorenes, polyphenylenes, polythiophenes and their copolymers). Therefore the presence of these units is acceptable in an insulating material for use in the present invention.

Other chemical/structural groups or moieties that are present in the dielectric either by design (as a structural unit, particularly as a repeating unit or end group) or as an impurity (including chain ends, polymerisation defects, stabilizers, catalysts and inadvertent contaminants) however may have considerably larger EAs. The present inventors have identified that in order to ensure that these moieties do not compete for the electrons, certain design rules must be complied with. Separate design rules may be considered in respect of reactive and non-reactive trapping groups. The design rules enable the selection of a desirable gate dielectric material relative to the organic semiconductor to be used. In this sense, the present invention is not limited to defining desirable dielectric materials per se. Instead, desirable dielectric materials may be defined depending on the organic semiconductor to be used.

Non-reactive Trapping Groups

For non-reactive traps, the trapping is reversible and so the criteria for a group to be non-trapping is for the solid-state EA for the chemical group in the dielectric material ($EA_x$) to be less than $EA_{semicond}$. By way of example some $EA_x$ values for common groups are shown below. In accordance with the present invention, these values are calculated from the gas-phase EA data. The solid state $EA_x$ value is calculated from the gas phase EA by adding the solid-state polarization energy which is taken here to be 1.8 eV as given by M. Pope and C. E. Swenberg, Electronic Processes in Organic Crystals and Polymers (Oxford University Press, 1999.

| Moiety X | Solid-state $EA_x$ (eV)[a] |
|---|---|
| (a) Aliphatic carbonyl (—CO—, —COO—, —CONR—) and CN | 1.8-2.0 |
| (b) Aromatic carbonyl (—CO—, —COO—, —CONR—) | 2.0-2.4 |
| (c) Aromatic fluorocarbons | 2.3 |
| (d) Quinoxalines | 2.5 |
| (e) Aliphatic fluorocarbons | 2.8-2.9 |
| (f) Quinones | 3.4-3.6 |

[a]Obtained by adding the polarization energy (taken to be 1.8 eV for the purposes of the present invention) to the gas-phase EA of appropriate model compounds.

Therefore, for an $EA_{semicond}$ value of 2-3 eV, the presence of (a) may be tolerated in the dielectric for some semiconductors. However, the presence of (b)-(d) at a concentration above the critical concentration may not compatible with n-channel activity of many organic semiconductors. Further, the presence of (e)-(f) above the critical concentration will not be compatible with most organic semiconductors. Because there are such a large number of possible moieties, only a few are provided here for analysis. $EA_x$ values for other groups can be determined in the same way.

Reactive Traps

Such traps undergo a coupled reaction that makes detrapping impossible. An example of a coupled reaction is the expulsion of a hydrogen atom from moieties with active hydrogens. Once this hydrogen atom is lost (through some other radical reaction or recombination to give hydrogen gas), the electron charge is irreversibly trapped on the moiety until some charge neutralization event occurs. In any case, the initially trapped electron is not re-emitted, and the capacitive charge density of the gate dielectric becomes filled by such immobile charges. In the case of reactive traps, the criteria for a group to be non-trapping requires a consideration of the reaction free energy. The gas phase EA values for reactive traps are not available. Thus, for the purposes of the present invention, it is necessary only to consider the reactive electron affinity for such groups.

Considering the acidic —COOH moiety by way of an example, this moiety is present as an impurity at the sub % level in poly(methyl methacrylate); and at the few % level in polyimides due to incomplete conversion of the precursor material. During reactive trapping, the reaction being considered is:

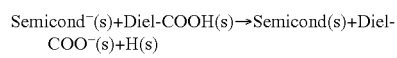

Semicond$^-$(s)+Diel-COOH(s)→Semicond(s)+Diel-COO$^-$(s)+H(s)

which represents trapping of the induced electron initially present in the semiconductor (semicond$^-$) onto —COO$^-$ in the dielectric (Diel-COO$^-$) with lost of an H atom.

The exact kinetic mechanism involved does not affect the energetics of the overall reaction, which can be expressed as the sum of two half-reactions:

| | | |
|---|---|---|
| (i) | Semicond⁻(s) → Semicond(s) + e⁻(g) | $EA_{semicond}$ |
| (ii) | Diel-COOH(s) + e⁻(g) → Diel-COO⁻(s) + H(s) | $-(EA_{rxn})$ |

Reaction (ii) involves the expulsion of a hydrogen atom. Here the energetics of reaction (ii) is denoted as the negative of the reactive electron-affinity ($EA_{rxn}$). The present invention therefore, defines an $EA_{rxn}$ for reactive traps, which can be estimated using a Born-Haber thermodynamic cycle for a corresponding small molecule model, an example of which is as follows:

| | | |
|---|---|---|
| (ii) (a) | Diel-COOH(s) → Diel-COOH(g) | $\Delta G_{subl}$ |
| (ii) (b) | Diel-COOH(g) → Diel-COO⁻(g) + H⁺(g) | $\Delta G_{deprot}$ |
| (ii) (c) | H⁺(g) + e⁻(g) → H (g) | $-\Delta G_{ion,H}$ |
| (ii) (d) | Diel-COO⁻(g) → Diel-COO⁻(s) | $\Delta G_{polar} - \Delta G_{subl}$ |
| (ii) (e) | H(g) → H(s) | $-\Delta G_{subl,H}$ | where the three key energy terms are respectively the gas-phase deprotonation energy ($\Delta G_{deprot}$), the negative of the H atom ionization energy ($-\Delta G_{ion,H}$=−13.6 eV), and the medium polarization energy ($\Delta G_{polar}$ taken here to be −1.8 eV) for a small molecule to model Diel-COOH.

The overall energy for reaction (ii) is the sum of these energies, $-EA_{rxn} = \Delta G_{deprot} - \Delta G_{ion,H} + \Delta G_{polar} - \Delta G_{subl,H} = \Delta G_{deprot} - 15.4$ eV. Sublimation energies $\Delta G_{subl,H}$ are sufficiently small (probably less than 0.1 eV) to be omitted. $\Delta G_{deprot}$ can be obtained from data tables. The primary factor governing whether a chemical group containing active hydrogen may act as a reactive trap is thus its deprotonation energy. $EA_{rxn}$ values obtained in this way for a range of common moieties that may act as reactive traps are tabulated below.

| | Moiety X | $\Delta G_{deprot}$ (eV) | $EA_{rxn}$ (eV) |
|---|---|---|---|
| (a) | Aliphatic-NHR | 16.6 | −1.2 |
| (b) | Aliphatic-OH | 15.9 | −0.5 |
| (c) | Aromatic-NHR | 15.5 | −0.1 |
| (d) | Aliphatic-SH | 15.1 | 0.3 |
| (e) | Aromatic-OH | 14.8 | 0.6 |
| (f) | Aliphatic-COOH | 14.8 | 0.6 |
| (g) | Aromatic-SH | 14.5 | 0.9 |
| (h) | Aromatic-COOH | 14.5 | 0.9 |

By experiment, the present inventors have determined that (e) and (f) generally are incompatible with n-channel FET conduction for a range of organic semiconductors (where $EA_{semicond.} \approx 2$–2.5 eV). Therefore, the present inventors propose that in order for a moiety to be non-trapping, its $EA_{rxn}$ should be less than that of $EA_{semicond}$ by at least 2 eV, i.e. $EA_{rxn} < (EA_{semicond} - 2$ eV$)$.

Without wishing to be bound by theory, this may be rationalized crudely by considering that the trapping rate ($k_r$) is a product of attempt frequency (v) and the probability of trap occupation (K). The value of K is estimated by standard chemical thermodynamics to be K=exp ($-\Delta G/kT$). For $k_r < 10^{-7}$ s⁻¹ (which corresponds to a characteristic trapping time >100 days for a trap concentration similar to the induced charge concentration) and v=$10^{15}$ s⁻¹ (the electronic frequency), we require K<$10^{-22}$ and hence $\Delta G > 1.5$ eV.

Therefore the analysis indicates that while (a)-(c) may be tolerated in the dielectric, (e)-(h) are not compatible with most organic semiconductors if present above the critical concentration. A similar analysis can be made for any other moieties of interest.

Nevertheless despite (a)-(c) being compatible on reactive EA grounds, these hydrogen bonding moieties tend to be hygroscopic and retain $H_2O$ strongly. $H_2O$ dispersed in the solid film has a high EA ($\approx 3.0$ eV), which then can make the presence of these moieties again incompatible with n-channel conduction with most organic semiconductors. It is for this reason that the insulating material preferably does not include more than 0.1% by weight —OH groups and other hydrogen-bonding groups. A very small concentration of —OH groups and other hydrogen-bonding groups may be tolerated in the insulating material. Preferably, the insulating polymer contains less than 0.01% by weight —OH groups and other hydrogen-bonding groups, more preferably less than 0.001% by weight —OH groups and other hydrogen-bonding groups. Most preferably the insulating polymer is substantially free of —OH groups and other hydrogen-bonding groups Taking as an example an organic semiconductor with an $EA_{semicond}$ of 2.5 eV, the following (non-exhaustive) groups if present must not exceed the critical concentration specified earlier: quinoxalines, aliphatic fluorocarbons, quinones, aromatic-OH, aliphatic-COOH, aromatic-SH, aromatic-COOH. The critical bulk concentration has been discussed above.

Organic dielectrics that contain these groups as defects, chain ends, stabilizers or contaminants need to be rigorously purified so that they are present below the critical concentration as discussed above.

Referring to the first aspect of the present invention, the transistor is an n-channel field-effect transistor or an ambipolar field-effect transistor. The transistor may have a top-gate or bottom-gate configuration.

In a transistor according to the present invention, the gate dielectric layer may be considered to comprise an organic gate insulating material together with any impurities. The gate dielectric layer preferably does not contain any trapping groups. This ensures that the concentration of trapping groups is below the critical concentration.

More preferably the organic gate insulating material per se does not comprise a repeat unit comprising a trapping group. Most preferably, the organic gate insulating material per se does not contain any trapping groups.

Typically, $EA_{semicond.}$ will be greater than or equal to 2 eV, although the present invention is not so limited. Also typically, $EA_{semicond.}$ will be in the range of from 2 eV to 4 eV, more typically in the range of from 2 eV to 3 eV.

As mentioned above, trapping groups in the insulating material may be a part of the insulating material per se (i.e. excluding impurities) or may be present as an impurity. Trapping groups also may be present as part of a residue unit that is present in the organic insulating material due to incomplete formation of the organic insulating material during preparation. It will be appreciated that whilst a trapping group may be tolerated as an end group, defect, stabilizer or impurity, it usually will not be tolerated as a repeating unit in the insulating material. This is because, when present as a repeating unit, it may bring the concentration of trapping groups to above the critical concentration. Trapping groups may or may not be tolerated in a residue unit depending on the concentration of residue units in the organic insulating material.

Preferably the insulating material does not contain a repeat unit or residue unit comprising a group having (i) an electron affinity $EA_x$ greater than or equal to 3 eV and/or (ii) a reactive electron affinity $EA_{rxn}$ greater than or equal to 0.5 eV.

Accordingly, preferably the insulating material does not contain a repeat unit or residue unit comprising a quinone, aromatic —OH, aliphatic —COOH, aromatic —SH, or aromatic —COOH group.

In some embodiments, preferably the insulating material does not comprise a repeat unit or residue unit having an electron affinity $EA_x$ greater than or equal to 2.5 eV, more preferably greater than or equal to 2 eV. In these embodiments, the insulating material preferably does not contain a repeat unit and/or residue unit comprising an aliphatic fluorocarbon group. More preferably, the insulating material does not contain a repeat unit and/or residue unit comprising an aromatic carbonyl, quinoxaline or aromatic fluorocarbon group.

Preferably the insulating material per se contains one or more groups independently selected from alkene, alkylene, cycloalkene, cycloalkylene, siloxane, ether oxygen, alkyl, cycloalkyl, phenyl, and phenylene groups. These groups may be substituted or unsubstituted. These groups optionally may be part of a repeat unit of the insulating material.

The insulating material per se may contain one or more groups independently selected from aliphatic carbonyl, cyano, aliphatic —NHR, aromatic —NHR, and. Again, these groups optionally may be part of a repeat unit of the insulating material.

In some embodiments, the insulating material may be made from a precursor to the insulating material. Such a precursor may be converted to the final insulating material by appropriate reaction. For example, where the final insulating material is crosslinked, a precursor insulating material may contain crosslinkable groups and the crosslinked insulating material may be formed from the precursor by heating, for example. Desirable groups to be present in a precursor insulating material include alkene and styrene groups.

In one embodiment the gate dielectric layer preferably comprises an organic insulating polymer. Examples of—insulating polymers which can be used after appropriate purification, are given below:

(i) Poly(siloxanes) and copolymers thereof; such as poly(dimethylsiloxane), poly(diphenylsiloxane-co-dimethyl-siloxane), and copolymers thereof.

(ii). Poly(alkenes) and copolymers thereof; such as atactic polypropylene, poly(ethylene-co-propylene), polyisobutylene, poly(hexene), poly(4-methyl-1-pentene) and copolymers thereof;

(iii) Poly(oxyalkylenes) and copolymers thereof, such as poly(oxymethylene), poly(oxyethylene), and copolymers thereof;

(IV) Poly(styrene) and copolymers thereof.

The repeat units in the above polymers, and indeed in any organic insulating polymer useable in the present invention, may be substituted or unsubstituted provided that the final insulating polymers comply with the above design rules. Substituents include functional substituents to enhance particular properties of the polymer such as solubility.

Crosslinked derivatives of the above polymers also are within the scope of the present invention.

Preferably, the insulating material is not a poly(imide).

Preferably the insulating polymer comprises an $Si(R)_2$—O—$Si(R)_2$ unit where each R independently comprises a hydrocarbon. In this regard, a preferred poly(siloxane) as mentioned above is an insulating polymer where the backbone of the polymer comprises a repeat unit comprising —Si$(R)_2$—O—Si$(R)_2$— where each R independently is methyl or substituted or unsubstituted phenyl. As specific example of such a polymer has general formula:

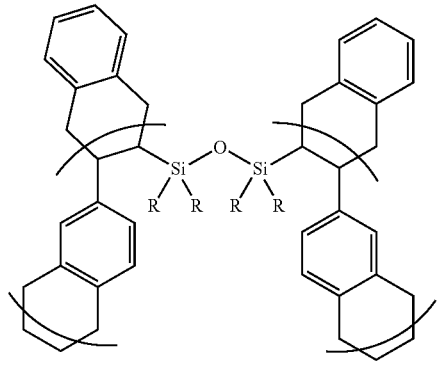

and may be substituted or unsubstituted. This polymer may be made by crosslinking monomers having general formula:

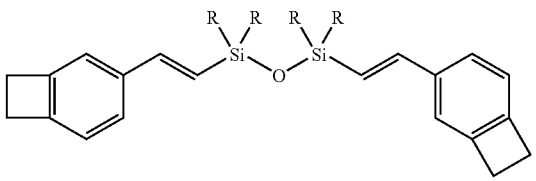

and derivatives thereof, for example bis(benzocyclobutane)-divinyltetramethyldisiloxane (available as Cyclotene®) or a derivative thereof.

In another embodiment, the insulating material preferably comprises an insulating oligomer or insulating small molecule.

In addition to consideration of the above design rules, it is important to select a dielectric material that can form a high quality interface with the adjacent semiconductive layer. The interface desirably is chemically stable, molecularly abrupt and molecularly smooth.

Further the dielectric layer preferably should show high dielectric breakdown strength, and very low electrical conductivity.

Also, the gate dielectric polymer must be compatible with the overall designated processing scheme of organic (particularly polymer) FETs. For example, its formation must not destroy earlier formed layer integrities, while it itself has to survive subsequent solvent and thermal processing (if any).

Further preferably the insulating material has low bulk electrical conductivity and high dielectric breakdown strength.

Also preferably, the insulating material has a glass transition temperature of greater than 120° C., most preferably greater than 150° C.

The bulk resistance of the insulating material preferably is greater than $10^{14}$ Ohm cm, most preferably greater than $10^{15}$ Ohm cm).

The insulating material desirably should be processable into a high-quality defect-free ultrathin film.

The dielectric breakdown strength advantageously may be greater than 1 MV/cm, preferably greater than 3 MV/cm.

(a) Preferably, the gate dielectric is thermally and mechanically stable up to 150° C., more preferably up to 300° C. When this is the case, the upper shelf/operating temperature of the device becomes essentially limited by the semiconducting polymer (and the attached electrodes).

In order to impart chemical and mechanical stability, the gate organic gate insulating material in one embodiment preferably is crosslinked.

In accordance with the present invention, the dielectric layer may consist of a single layer of a single insulating material or may comprise more than one layer of insulating materials or a blend of insulating materials.

Semiconductive materials that are usable in the present invention include small molecules, oligomers and polymers.

Some examples of suitable semiconductive polymers are: poly(fluorene) homopolymers and copolymers, poly(p-phenylenevinylene) homopolymers and copolymers, poly(oxadiazole) homopolymers and copolymers, poly(quinoxaline) homopolymers and copolymers, and homopolymers and copolymers that include one or more groups selected from perylenetetracarboxylic diimide, naphthalenetetracarboxlic dianhydride, quinoline, benzimidiazole, oxadiazole, quinoxalines, pyridines, benzothiadiazole, acridine, phenazine, and tetraazaanthracene.

The repeat units in the above polymers, and indeed in any semiconductive polymer useable in the present invention, may be substituted or unsubstituted provided that the final semiconductive polymers comply with the above design rules. Substituents include functional substituents to enhance particular properties of the polymer such as solubility.

Crosslinked derivatives of the above semiconductive polymers also are within the scope of the present invention.

Equivalent oligomers of the above polymers are usable in the present invention.

In some embodiments, the semiconductive polymer may be made from a precursor polymer. Such a precursor may be converted to the final semiconductive polymer by appropriate reaction. For example, where the final semiconductive polymer is crosslinked, a precursor semiconductive polymer may contain crosslinkable groups and the crosslinked semiconductive polymer may be formed from the precursor by heating, for example.

Some examples of suitable semiconductive small molecules are: pentacene, perylenetetracarboxylic dianhydride and diimide, naphthalenetetracarboxlic dianhydride and diimide.

Preferably the charge-carrier mobility is as high as possible. Presently, typical values obtainable with the present invention are in the range $10^{-5}$-$10^{-1}$ $cm^2/V$ s.

Referring to the second aspect according to the present invention, suitable methods for making the present transistor will be known to those skilled in this art. Clearly, processing conditions must be selected so that trapping groups are not present in the dielectric layer above the critical concentration. This will involve the selection of appropriate processing conditions particularly when forming the dielectric layer, for example so that the final dielectric layer does not contain residual units that may act as traps above the critical concentration.

In the method according to the second aspect of the present invention, the dielectric layer and the/or the semiconductive layer preferably are formed by solution processing.

Where the insulating material is crosslinked, a solution containing reactant material for making the crosslinked insulating material may be deposited by solution processing. The reactant material is then cured to make the crosslinked insulating material. One common mechanism for curing is a condensation reaction which crosslinks the reactant material. This condensation reaction typically involves the loss of —OH leaving groups from the reactant material. However, where curing proceeds via a condensation reaction with the loss of —OH leaving groups, this typically will not remove all —OH leaving groups that were present in the reactant material. Thus, the final crosslinked insulating material will include residual —OH leaving groups. As described above this is disadvantageous and as such, the reactant material for making the crosslinked insulating material preferably does not include any —OH leaving groups. Preferably, the crosslinking group in the insulating material is derivable from a crosslinkable group in the reactant material that can be cured without the loss of a leaving group. Examples of such reactions include Diels-Alder reactions between a diene and a dienophile (as exemplified by the reaction between benzocyclobutene and alkene), and a hydrosilylation reaction between Si—H and alkene.

The present invention now will be described in further detail with reference to the attached Figures in which.

EXAMPLES

Example 1

As an illustration of the general principle, a p-doped silicon substrate with 200-nm $SiO_2$ layer is overcoated with a 50-nm-thick BCB layer by spinning a 4.4 w/v % BCB (Cyclotene®, The Dow Chemical Company) solution in mesitylene, and then rapid-thermal-annealed on a hotplate set at 290° C. 15 s under nitrogen ($pO_2$<5 ppm). The required organic semiconductor is then spin cast over the substrate as a thin film 50-80-nm thick from a 1.3-1.8 w/v % solution in the appropriate solvent. We have tested with a range of conjugated polymers: (i) poly(9,9-dioctylfluorene-alt-benzo-2-thia-1,3-diazole) ("F8BT") from mixed xylenes, (ii) poly(9,9-dioctylfluorene-2,7-diyl) ("F8") from mixed xylenes, (iii) poly(2,5-dihexyl-p-phenylenevinylene-co-α,α'-dicyano-2,5 dihexyl-p-phenylenevinylene) ("CN-PPV") from toluene, (iv) poly(2-methoxy-5-(3,7-dimethyl) octoxy-p-phenylenevinylene) ("OC1C10-PPV") from 1:3 (v/v) THF:toluene and (v) precursor PPV ("PPV") from methanol. 100-nm calcium electrode is deposited through a shadow mask and the electrode encapsulated with 30-nm SiO to give source-drain top-contact electrodes with channel length 25 μm and width 2.5 mm. Transistors were then tested in glove box.

Figure 1A:
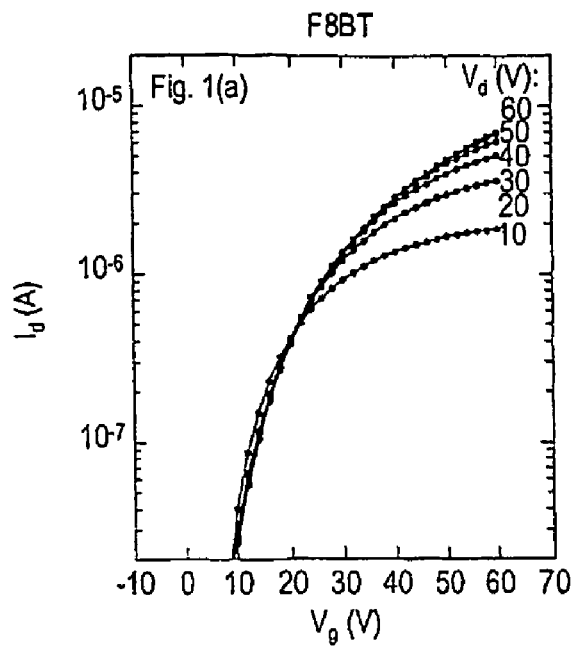
FIGS. 1a and 1b show the transfer and output characteristics respectively for a transistor using F8BT as the semiconductive layer in accordance with Example 1.
Figure 1B:
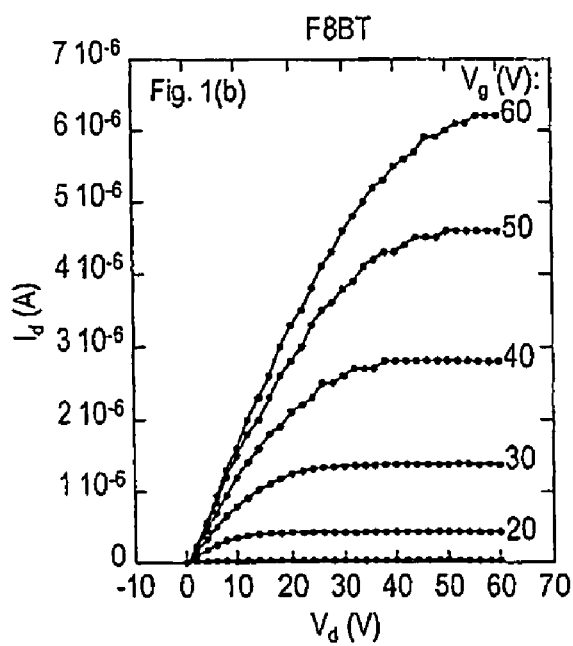
Figure 1C:
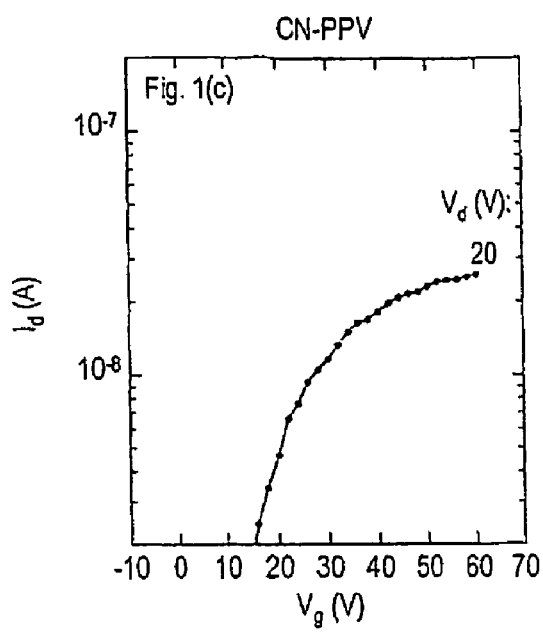
FIG. 1c shows the transfer characteristics for a transistor using CN-PPV as the semiconductive layer in accordance with Example 1.
Figure 1D:
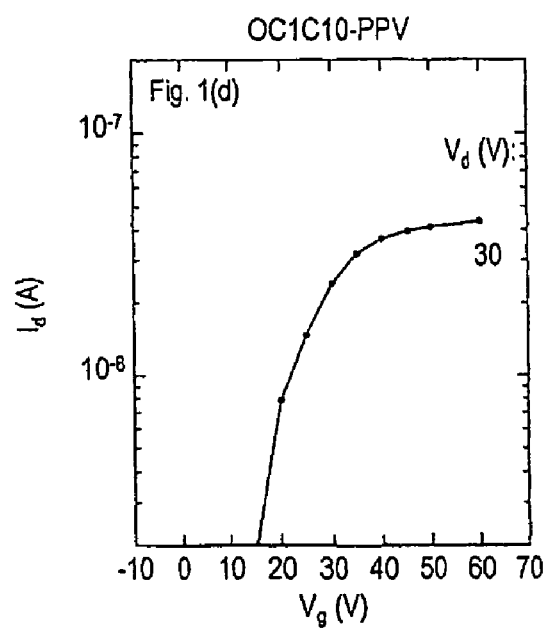
FIG. 1d shows the transfer characteristics for a transistor using OC1C10-PPV as the semiconductive layer in accordance with Example 1.
Figure 1E:
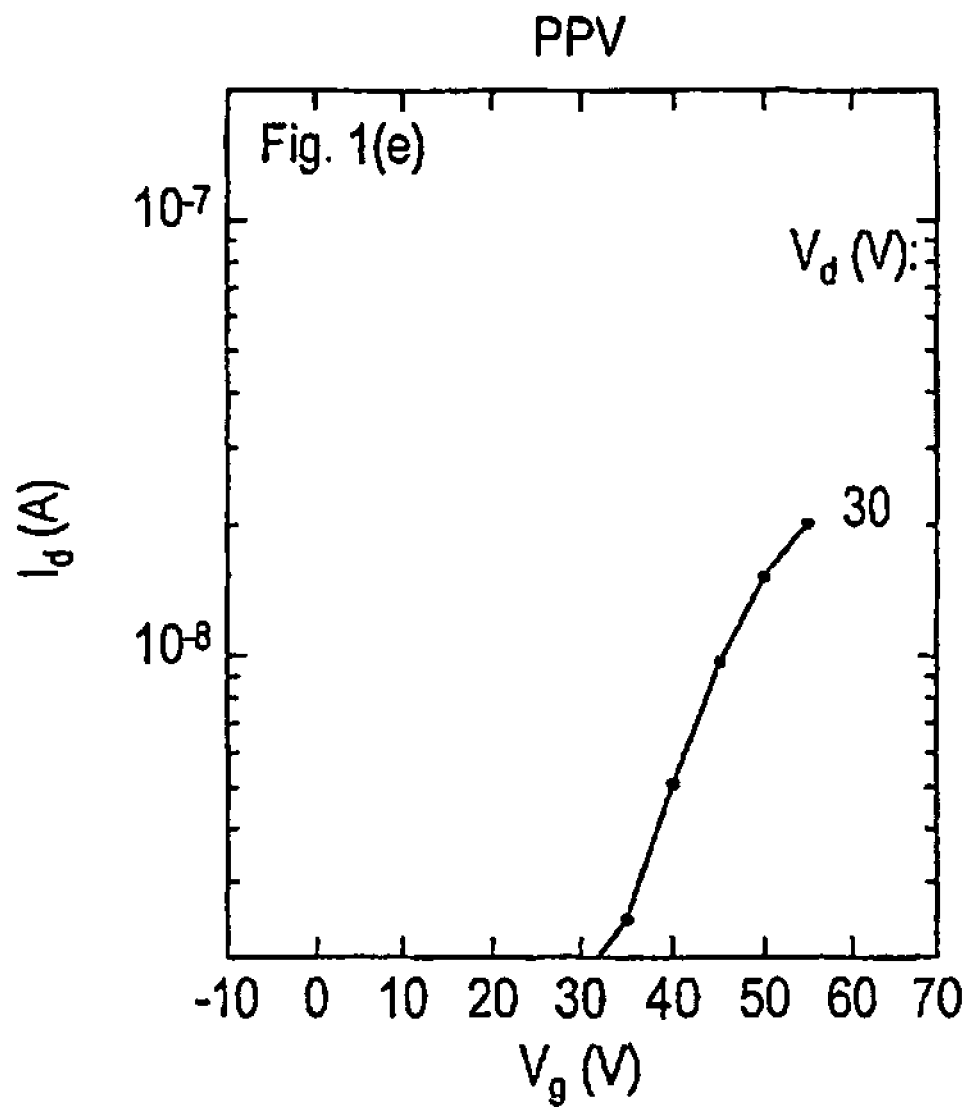
FIG. 1e shows the transfer characteristics for a transistor using PPV as the semiconductive layer in accordance with Example 1.

Representative results are shown in FIGS. 1(a)-(e). FIGS. 1(a) and (b) show the transfer and output characteristics respectively for F8BT. The linear-regime mobility ($\mu_{FET,e}$) is estimated to be $5\times10^{-3}$ $cm^2/Vs$. FIG. 1(c) shows the transfer characteristic of CN-PPV ($\mu_{FET,e}=3\times10^{-5}$ $cm^2/Vs$). FIG. 1(d) shows the transfer characteristic of OC1C10-PPV ($\mu_{FET,e}=4\times10^{-5}$ $cm^2/Vs$). FIG. 1(e) shows the transfer characteristic of PPV ($\mu_{FET,e}=5\times10^{-5}$ $cm^2/Vs$). The PPV and OC1C10-PPV films studied here have a relatively high impurity level which causes a high threshold and drift in device characteristics. F8 has $\mu_{FET,\,e}=1\times10^{-3}$ cm$^2$/Vs (transfer characteristic not shown).

Without overcoating with the BCB dielectric as in this example, no significant n-channel activity can be observed even after passivating the SiO$_2$ surface with hexamethyldisilazane. This observation is consistent with the high EA$_{rxn}$ expected for the residual silanol groups on the surface of SiO$_2$.

This set of examples is provided to show the principle that appropriate choice of gate dielectric can permit the fabrication of n-channel FETs with a wide range of organic semiconductors so long as the appropriate injection contacts is achieved.

When poly(methyl methacrylate) is used as the gate dielectric (in a top-gate FET), the obtained n-channel FET mobility is very poor, with $\mu_{FET,\,e}$ typically less than $10^{-6}$ cm$^2$/Vs in the poly(fluorene) derivatives. When poly(vinyl phenol) is used as the gate dielectric, no n-channel FET behaviour can be obtained. When hexamethyldisilazane-treated SiO$_2$ is used as the gate dielectric, no n-channel FET behaviour can be obtained either. All of these observations are consistent with the design rules of the present invention.

Example 2

As a further illustration of the general principle, this time with aluminium source-drain electrodes: a p-doped silicon substrate with 200-nm SiO$_2$ layer is overcoated with a 50-nm-thick BCB layer by spinning a 4.4w/v % BCB (Cyclotene®, The Dow Chemical Company) solution in mesitylene, and then rapid-thermal-annealed on a hotplate set at 290° C. 15 s under nitrogen (pO$_2$<5 ppm). The required organic semiconductor is then spin cast over the substrate as a thin film 50-80-nm thick from a 1.3-1.8 w/v % solution in the appropriate solvent. We have tested with two conjugated polymers: (i) poly(9,9-dioctylfluorene-alt-benzo-2-thia-1,3-diazole) ("F8BT") from mixed xylenes, and (ii) poly(2,5-dihexyl-p-phenylenevinylene-co-α, α'-dicyano-2,5-dihexyl-p-phenylene-vinylene) ("CN-PPV") from toluene, 100-nm aluminium electrode is deposited through a shadow mask. Transistors were then tested in glove box.

Figure 2A:
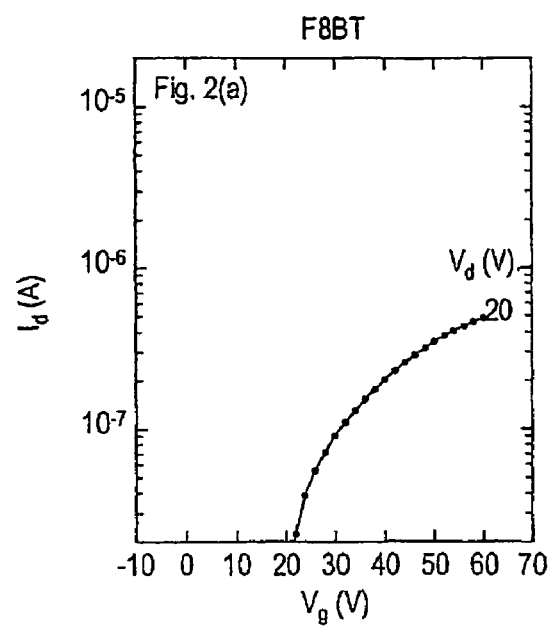
FIGS. 2a and 2b show the transfer and output characteristics respectively for a transistor using F8BT as the semiconductive layer in accordance with Example 2.
Figure 2B:
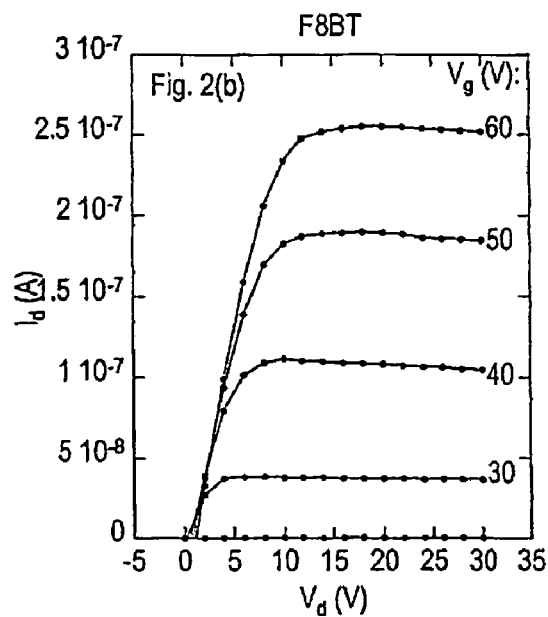
Figure 2C:
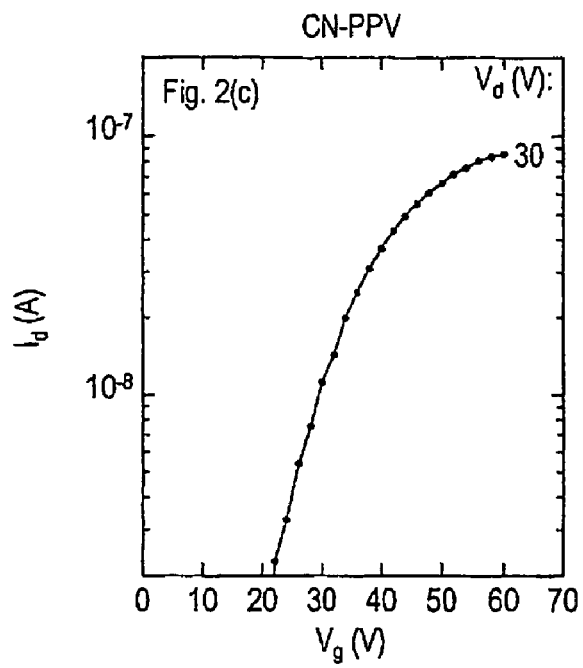
FIGS. 2c and 2d show the transfer and output characteristics respectively of a transistor using CN-PPV as the semiconductive layer in accordance with Example 2.
Figure 2D:
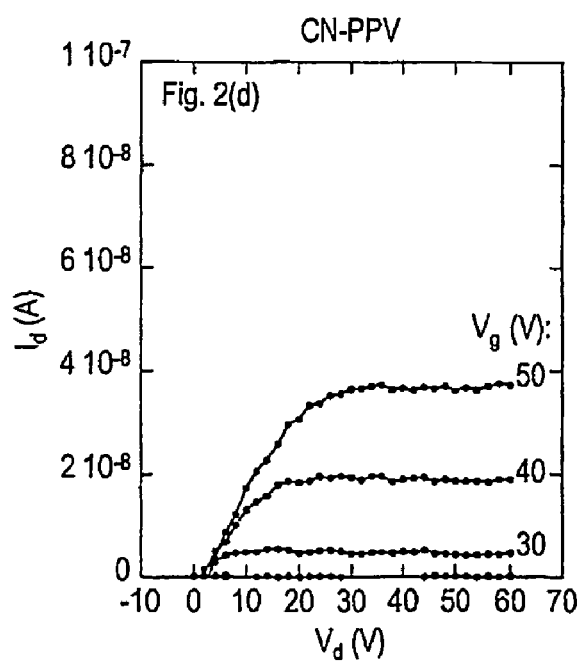

Representative results are shown in FIGS. 2(a)-(d). FIGS. 2(a) and (b) show the transfer and output characteristics respectively for F8BT. The linear-regime mobility ($\alpha_{FET,\,e}$) is estimated to be $4\times10^{-4}$ cm$^2$/Vs. This is one order of magnitude lower than with Ca electrodes. The output characteristics also saturate too early. Both of these are indicative of high contact resistance with the aluminium electrodes. But nevertheless n-channel activity has still been obtained. FIGS. 2(c) and (d) show the transfer and output characteristic of CN-PPV ($\mu_{FET,\,e}=4\times10^5$ cm$^2$/Vs). This is comparable to the Ca devices and indicate that Al can inject sufficiently well into CN-PPV.

This set of examples is provided to show again the principle that appropriate choice of gate dielectric as discussed in this invention can permit the fabrication of n-channel FETs with a wide range of organic semiconductors with the appropriate injection contacts.

Example 3

As a further illustration of the general principle, this time with gold source-drain electrodes prepatterned on a glass substrate and with a top gate: the glass substrate is coated with 50-80-nm thick poly(9,9-dioctylfluorene-alt-benzo-2-thia-1,3-diazole) from a 1.7 w/v % solution in mixed xylenes. The gate dielectric layer is then deposited by spinning a 200-nm-thick BCB layer from a 12.7 w/v % BCB (extracted from Cyclotene®, The Dow Chemical Company) solution in decane at 30-40° C., and then rapid-thermal-annealed on a hotplate set at 290° C. 15s under nitrogen (pO$_2$<5 ppm). The top-gate electrode is then deposited by printing a surfactant-ion-exchanged poly(3,4-ethylenedioxythiophene)-poly(styrenesulfonate) complex ("PEDT:PSSR"). This surfactant-ion-exchanged PEDT:PSSR complex is made from Baytron P(HC Starck of Leverkusen, Germany) by dialysis exchange with hexadecyltrimethylammonium after enriching the Baytron P with poly(styrenesulfonic acid) to give PEDT:PSS ratio of 10-16.

The electron mobility is ca. $10^{-4}$ cm$^2$/Vs, and is limited by injection. Therefore further improvements can be made by appropriately functionalising the gold electrode to improve its effective work-function, using dipolar self-assembled monolayers.

This example is provided to show that the principles taught in this invention can be applied also to top gate devices with practical injection contacts.

The invention claimed is:

1. An n-channel or ambipolar field-effect transistor including an organic semiconductive layer having an electron affinity EA$_{semicond}$; and an organic gate dielectric layer forming an interface with the semiconductive layer; characterised in that the bulk concentration of trapping groups in the gate dielectric layer is less than $10^{18}$ cm$^{-3}$, where a trapping group is a group having (i) an electron affinity EA$_x$ greater than or equal to EA$_{semicond}$ and/or (ii) a reactive electron affinity EA$_{rxn}$ greater than or equal to (EA$_{semicond.}$-2 eV).

2. A transistor according to claim 1, wherein the transistor is an ambipolar field-effect transistor.

3. A transistor according to claim 1 wherein EA$_{semicond.}$ is greater than or equal to 2 eV.

4. A transistor according to claim 3 wherein EA$_{semicond.}$ is in the range of from 2 eV to 4 eV.

5. A transistor according to claim 1 wherein the gate dielectric layer comprises an organic insulating material and the organic insulating material does not contain a repeat unit or residue unit comprising a trapping group.

6. A transistor according to claim 1, wherein the insulating material does not contain a repeat unit or residue unit comprising a group having (i) an electron affinity EA$_x$ greater than or equal to 3 eV and/or (ii) a reactive electron affinity EA$_{rxn}$ greater than or equal to 0.5 eV.

7. A transistor according to claim 6 wherein the insulating material does not contain a repeat unit or residue unit comprising a quinone, aromatic —OH, aliphatic —COOH, aromatic —SH, or aromatic —COOH group.

8. A transistor according to claim 1, wherein the insulating material contains one or more groups selected from alkene, alkylene, cycloalkene, cycloalkylene, siloxane, ether oxygen, alkyl, cycloalkyl, phenyl, and phenylene groups.

9. A transistor according to claim 1 wherein the insulating material comprises an insulating polymer.

10. A transistor according to claim 9, wherein the insulating polymer is selected from the group consisting of substituted and unsubstituted poly(siloxanes) and copolymers thereof; substituted and unsubstituted poly(alkenes) and copolymers thereof; substituted and unsubstituted poly(styrenes) and copolymers thereof; and substituted and unsubstituted poly(oxyalkylenes) and copolymers thereof.

11. A transistor according to claim 10, wherein the backbone of the insulating polymer comprises a repeat unit comprising —Si(R)$_2$—O—Si(R)$_2$— where each R independently is methyl or substituted or unsubstituted phenyl.

12. A transistor according to claim 9, wherein the insulating polymer is crosslinked.

13. A transistor according to claim 1 wherein the organic semiconductive layer comprises a semiconductive polymer.

14. A transistor according to claim 1 wherein the organic semiconductive layer comprises a semiconductive oligomer.

15. A transistor according to claim 1 wherein the organic semiconductive layer comprises a semiconductive small molecule.

16. A method for making a transistor as defined in claim 1.

17. Use of a transistor according to claim 1 for n-channel conduction in an n-channel or ambipolar field effect transistor.

18. Use of an organic gate insulating material that does not contain any chemical groups having (i)$EA_x$ greater than or equal to 3 eV and/or (ii)$EA_{rxn}$ greater than or equal to 0.5 eV, for n-channel conduction.

19. Use according to claim 18, wherein the insulating material does not contain any chemical groups having (i)$EA_x$ greater than or equal to 2 eV and/or ($EA_{rxn}$) greater than or equal to 0 eV.

20. A circuit, complementary circuit, or logic circuit including a transistor as defined in claim 1.

21. A method for making a circuit, complementary circuit, or logic circuit as defined in claim 20.

* * * * *